(12) United States Patent
Mazzocco et al.

(10) Patent No.: US 11,018,036 B2
(45) Date of Patent: *May 25, 2021

(54) CARRIER ADAPTER INSERT APPARATUS AND CARRIER ADAPTER INSERT DETECTION METHODS

(71) Applicant: Applied Materials, Inc., Santa Clara, CA (US)

(72) Inventors: John J. Mazzocco, San Jose, CA (US); Edward Ng, San Jose, CA (US); Douglas MacLeod, Los Altos, CA (US); David Phillips, Austin, TX (US); Ayan Majumdar, San Jose, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 37 days.

This patent is subject to a terminal disclaimer.

(21) Appl. No.: 16/102,670

(22) Filed: Aug. 13, 2018

(65) Prior Publication Data

US 2018/0350637 A1 Dec. 6, 2018

Related U.S. Application Data

(63) Continuation of application No. 14/332,976, filed on Jul. 16, 2014, now Pat. No. 10,115,616.

(60) Provisional application No. 61/847,732, filed on Jul. 18, 2013.

(51) Int. Cl.
*H01L 21/00* (2006.01)
*H01L 21/673* (2006.01)
*G01V 8/12* (2006.01)
*H01L 21/67* (2006.01)

(52) U.S. Cl.
CPC ............ *H01L 21/6732* (2013.01); *G01V 8/12* (2013.01); *H01L 21/67259* (2013.01)

(58) Field of Classification Search
CPC ............... H01L 21/673; H01L 21/6732; H01L 21/6773; G01V 8/12
See application file for complete search history.

(56) References Cited

U.S. PATENT DOCUMENTS

| | | |
|---|---|---|
| 5,667,388 A | 9/1997 | Cottrell |
| 6,454,508 B2 | 9/2002 | Toshima et al. |
| 6,454,519 B1 | 9/2002 | Toshima et al. |
| 6,599,076 B2 | 7/2003 | Toshima et al. |
| 6,955,197 B2 | 10/2005 | Elliot |

(Continued)

OTHER PUBLICATIONS

Non-Final Office Action of U.S. Appl. No. 14/332,976 dated Dec. 27, 2016.

(Continued)

*Primary Examiner* — Rebecca C Bryant
(74) *Attorney, Agent, or Firm* — Lowenstein Sandler LLP

(57) ABSTRACT

Methods, apparatus, and assemblies are provided for a substrate carrier adapter insert including an adapter frame including a support rail adapted to support one or more substrates in a substrate carrier, a frame extension coupled to, or integral with, the adapter frame, and a mapping feature formed on the frame extension and disposed to be detected by a sensor for determining whether an adapter insert is present or absent in a substrate carrier. Numerous additional features are disclosed.

18 Claims, 4 Drawing Sheets

(56) References Cited

U.S. PATENT DOCUMENTS

| | | | |
|---|---|---|---|
| 7,147,424 | B2 | 12/2006 | Weaver |
| 7,258,520 | B2 | 8/2007 | Weaver |
| 7,275,905 | B2 | 10/2007 | Lee |
| 7,299,831 | B2 | 11/2007 | Elliot |
| 7,467,919 | B2 | 12/2008 | Weaver |
| 7,611,319 | B2 | 11/2009 | Shah et al. |
| 9,171,748 | B2 * | 10/2015 | Hatano ............. H01L 21/67775 |
| 2003/0002960 | A1 | 1/2003 | Toshima et al. |
| 2003/0122146 | A1 * | 7/2003 | Iijima ............... H01L 21/67383 |
| | | | 257/100 |
| 2006/0245854 | A1 | 11/2006 | Toshima et al. |
| 2007/0116545 | A1 | 5/2007 | Rice et al. |
| 2007/0140822 | A1 | 6/2007 | Elliott et al. |
| 2010/0192806 | A1 * | 8/2010 | Heugel ................. B33Y 40/00 |
| | | | 106/286.1 |
| 2010/0194420 | A1 * | 8/2010 | Kitazume .......... G01R 1/06727 |
| | | | 324/756.03 |
| 2015/0022821 | A1 | 1/2015 | Mazzocco et al. |

OTHER PUBLICATIONS

Mar. 1, 2017 Reply to Dec. 27, 2016 Non-Final Office Action of U.S. Appl. No. 14/332,976.
Final Office Action of U.S. Appl. No. 14/332,976 dated Apr. 28, 2017.
Jun. 22, 2017 Reply to Apr. 28, 2017 Final Office Action of U.S. Appl. No. 14/332,976.
Advisory Action of U.S. Appl. No. 14/332,976 dated Jul. 3, 2017.
Non-Final Office Action of U.S. Appl. No. 14/332,976 dated Oct. 19, 2017.
Jan. 8, 2018 Reply to Oct. 19, 2017 Non-Final Office Action of U.S. Appl. No. 14/332,976.
Final Office Action of U.S. Appl. No. 14/332,976 dated Apr. 9, 2018.
Jun. 11, 2018 Reply to Apr. 9, 2018 Final Office Action of U.S. Appl. No. 14/332,976.
Advisory Action of U.S. Appl. No. 14/332,976 dated Jul. 2, 2018.
Notice of Allowance of U.S. Appl. No. 14/332,976 dated Aug. 27, 2018.
Comments on Examiners Statements for Reasons of Allowance of U.S. Appl. No. 14/332,976, filed Sep. 24, 2018.

* cited by examiner

US 11,018,036 B2

CARRIER ADAPTER INSERT APPARATUS AND CARRIER ADAPTER INSERT DETECTION METHODS

RELATED APPLICATION

This application is a continuation application of, and claims priority to, U.S. patent application Ser. No. 14/332,976, filed Jul. 16, 2014, titled "CARRIER ADAPTER INSERT APPARATUS AND CARRIER ADAPTER INSERT DETECTION METHODS", which claims priority to and the benefit of U.S. Provisional Patent Application No. 61/847,732, filed Jul. 18, 2013, entitled "CARRIER ADAPTER INSERT APPARATUS AND CARRIER ADAPTER INSERT DETECTION METHODS", each of which is hereby incorporated herein by reference in its entirety for all purposes.

BACKGROUND

In some electronic device manufacturing facilities, larger size substrates (e.g., 450 mm) may be used to develop electronic devices. Thus, such facilities may be equipped with substrate carriers (e.g., front opening unified pods, also known as FOUPS) adapted to hold these larger size substrates. However, such facilities may also develop devices using smaller size substrates (e.g., 300 mm) and thus, carriers suitable for holding and transporting the smaller size substrates may be employed. However, tools and transport systems adapted to accommodate two or more sizes of substrate carriers can be expensive, redundant, and add undesired complexity and equipment to the manufacturing facility. Thus, conventional adapter inserts 100 as depicted in FIG. 1 have been developed to allow, for example, carriers designed to hold larger 450 mm substrates to be adapted to hold smaller 300 mm substrates.

Such conventional adapter inserts 100 can include a top frame portion 102, a bottom frame portion 104 and two or more support rails 106, 108 extending between the top frame portion 102 and the bottom frame portion 104. The support rails 106, 108 include slots that receive and support smaller size substrates (e.g., 300 mm substrates) therein. The top frame portion 102 and the bottom frame portion 104 are sized and positioned to fit within slots of a larger size (e.g., 450 mm) substrate carrier at locations where two larger size substrates would ordinarily be held.

Even though the conventional adapter inserts 100 allow larger size carriers to safely and securely hold smaller size substrates, such conventional adapter inserts 100 may still require the robots and transfer systems of the manufacturing facility to be specially adapted to accommodate both substrate carriers with conventional adapter inserts 100 and carriers without such adapters, which can be expensive and add undesired complexity to the manufacturing facility. Thus, what is needed are improved adapter inserts and methods of detecting installed adapter inserts that do not require complex and expensive adaptions of existing robots and transfer systems of existing manufacturing facilities.

SUMMARY

Embodiments of the present invention provide systems, methods, and apparatus for an adapter insert. The adapter insert includes an adapter frame, a support rail coupled to the adapter frame and adapted to support one or more substrates, a frame extension adapted to be coupled to the adapter frame, and a mapping feature formed on the frame extension and disposed to be detected by a sensor for determining whether an adapter insert is present or absent in a substrate carrier. Numerous additional features are disclosed.

In another embodiment, a substrate carrier adapter apparatus is provided. The substrate carrier adapter apparatus includes an adapter insert frame, and a mapping feature coupled to, or integral with, the adapter insert frame and disposed to be detected by a sensor for determining whether the substrate carrier adapter apparatus is present or absent in a substrate carrier.

Some embodiments of the present disclosure include computer-implemented methods for loading/unloading a substrate carrier. Some methods include providing a substrate carrier for loading or unloading of substrates, and determining whether an adapter insert is present or absent based on detecting a mapping feature. Subsequently, mapping of any substrates within the carrier based on the determining may be carried out.

In another embodiment, a substrate carrier assembly is provided. The substrate carrier assembly includes a substrate carrier, and an adapter insert received in the substrate carrier, the adapter insert including an adapter frame, a support rail coupled to the adapter frame and adapted to support one or more substrates, a frame extension coupled to the adapter frame, and a mapping feature formed on the frame extension and disposed to be detected by a sensor for determining whether an adapter insert is present or absent in the substrate carrier.

Numerous other aspects and embodiments are provided. Other features and aspects of the present invention will become more fully apparent from the following detailed description, the appended claims, and the accompanying drawings.

DESCRIPTION

The present invention provides systems, methods, and apparatus to allow substrate carriers designed to hold substrates of a first size to be adapted to hold substrates of a second size without requiring extensive adaptation of the robots and transfer systems of a manufacturing facility. By adding a mapping feature or flag to an adapter insert, the existing substrate mapping sensors on the robot's end effector are easily able to detect the presence of the adapter insert of the present invention within the substrate carrier. The mapping feature (e.g., flag or other suitable structure) can be mounted on any practicable part of the frame (e.g., upper and/or lower portion) or support rails of the adapter insert and in some embodiments, the mapping feature can be formed from a portion of a cross bar or extension that mounts on one or more portions of the frame and/or support rails.

Figure 1:
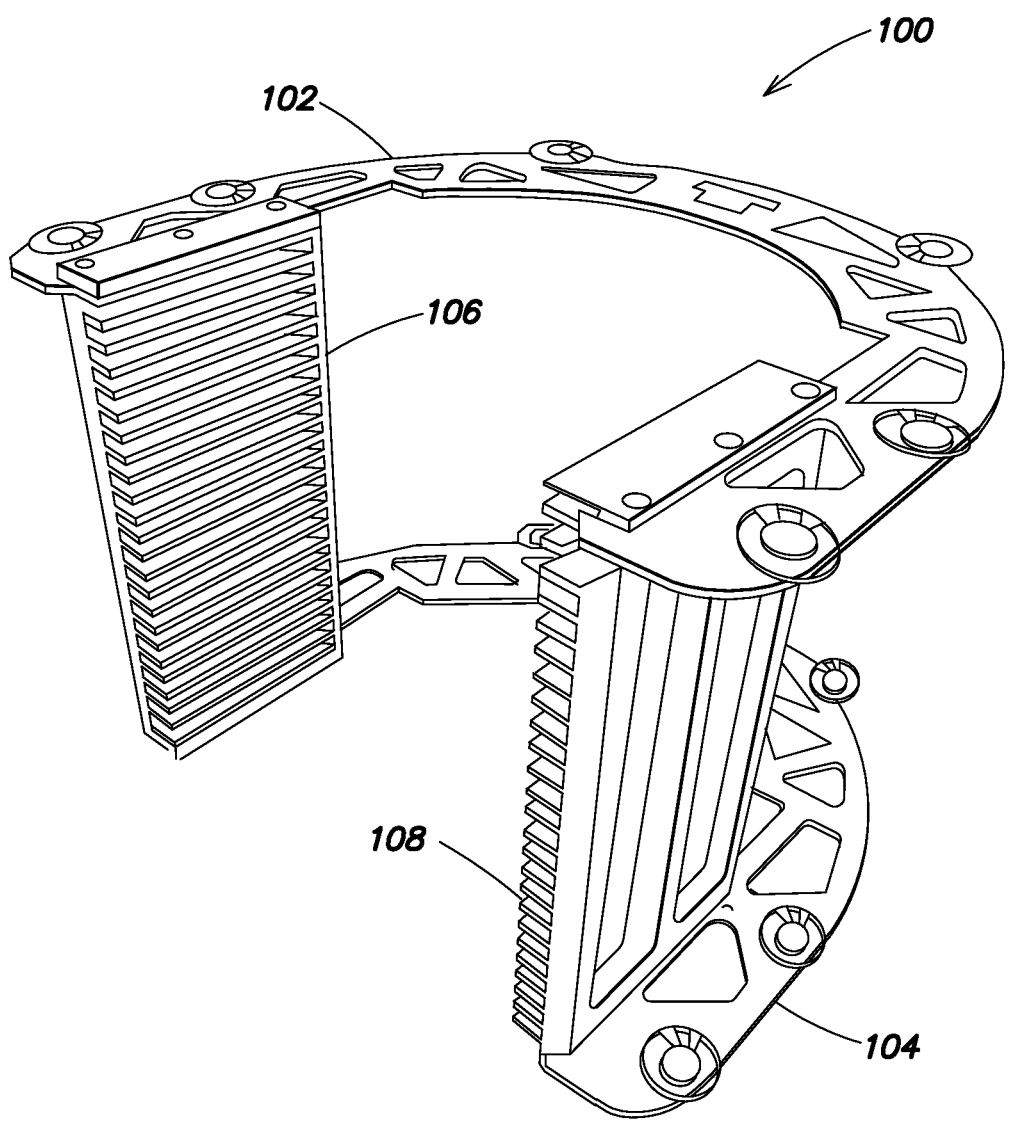
FIG. 1 depicts an adapter insert according to the prior art.
Figure 2:
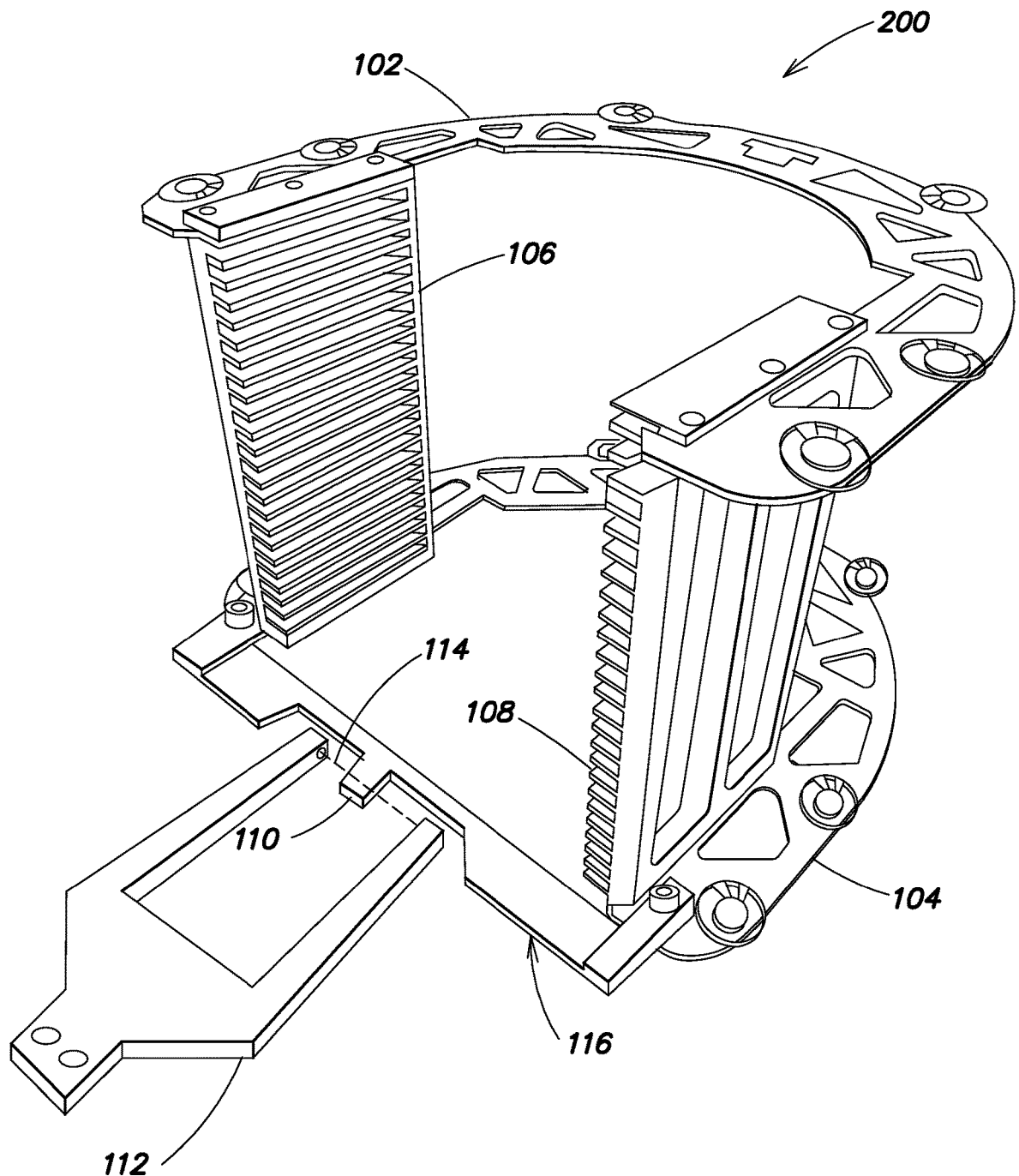
FIG. 2 depicts a first example embodiment of an adapter insert in accordance with some embodiments.

Turning now to FIG. 2, an example embodiment of an adapter insert 200 according to the present invention is illustrated. As seen in the drawing, the conventional adapter insert 100 is modified to include a mapping feature 110. Existing end effectors 112 can include mapping sensors with a light signal generator and a light signal receiver. The end effector 112 may be moved past the mapping feature 110 and the presence of the adapter insert 200 within the substrate carrier may be determined by the light beam 114 (shown dotted) being broken by the mapping feature 110. Detection of the mapping feature 110 may be carried out by any suitable sensor system, such as a sensor on an end effector or load port door or at another suitable location.

Note that any suitably shaped mapping feature 110 may be used to form the novel adapter insert 200 according to embodiments of the present invention, such as a tab or contour extending from a front of the adapter insert 200. Any practicable materials may be used to form the mapping feature 110 and the frame extension 116 that supports the mapping feature 110.

In the depicted embodiment, the mapping feature 110 is formed, or part of, a frame extension 116 that is coupled to or integral with the lower frame portion 104. However, the mapping feature 110 may be disposed on, or part of, any portion of the adapter insert frame, such as the top frame portion 102, or even disposed on, or part of, the support rails 106, 108. Any suitably shaped feature may be used. In some embodiments, the mapping feature 110 may include vertically-spaced indicator portions that have predetermined spacing different than the spacing of substrates held in the adapter insert 200.

Figure 3:
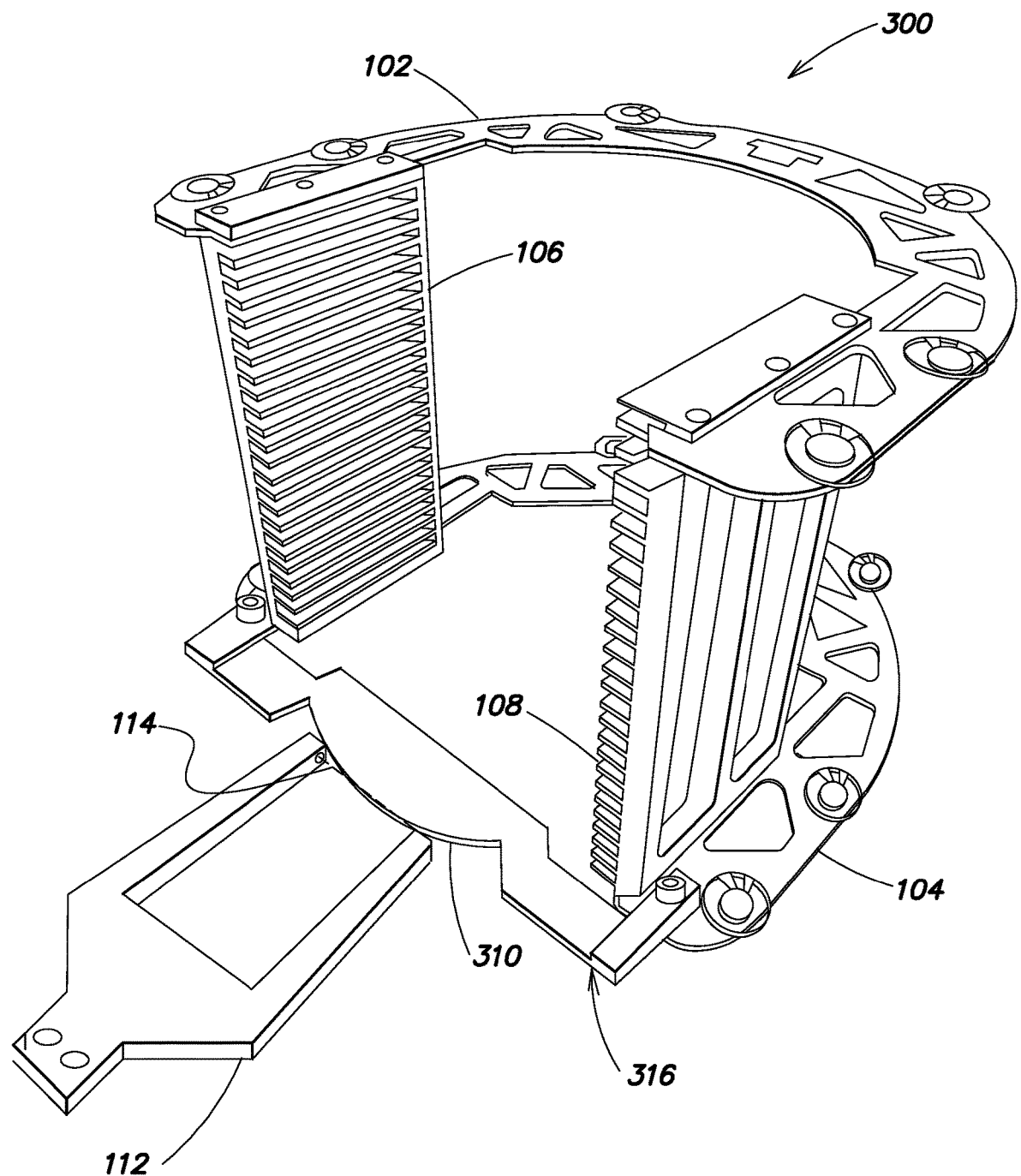
FIG. 3 depicts a second example embodiment of an adapter insert in accordance with some embodiments.

FIG. 3 depicts a second embodiment of a novel adapter insert 300 including a mapping feature 310 on the adapter insert frame, and, in particular, that extends from frame extension 316. In the depicted embodiment, the mapping feature 310 is formed or part of a frame extension 316 that is coupled to or integral with the lower frame portion 104. Note that the contoured shape of the mapping feature 310 corresponds to the curved shape of a substrate held in the adapter insert 300. Thus, in this embodiment, detecting the adapter insert 300 using the mapping feature 310 is similar to detecting a substrate in a substrate carrier. Any practicable materials may be used to form the mapping feature 310 and the frame extension 316, such as aluminum.

Figure 4:
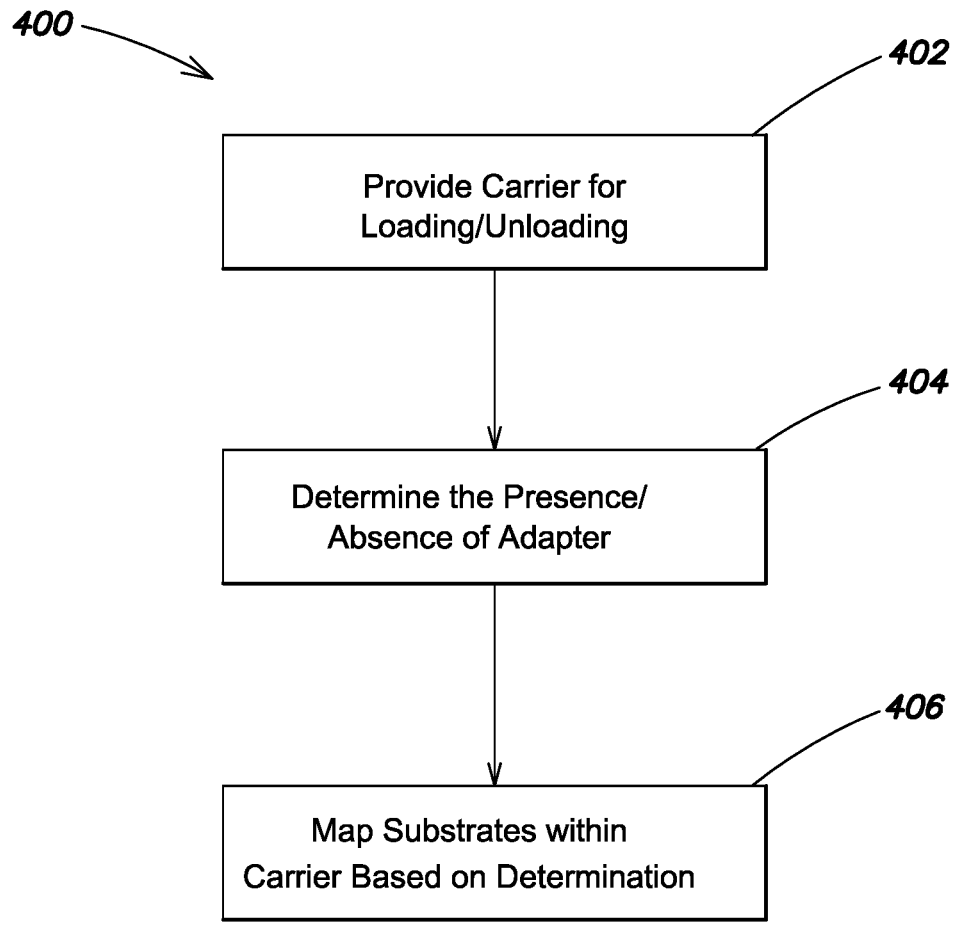
FIG. 4 depicts a flowchart illustrating an example method in accordance with some embodiments.

Turning now to FIG. 4, methods of one or more embodiments of the present invention are described. Note that embodiments of the present invention may include a programmed computer system adapted to receive and store data from an end effector 112 or robotic system that supports the end effector 112, or otherwise receive information from a mapping sensor. The computer system may include one or more processors for executing instructions or programs that implement the methods described herein. The computer system may include memory and persistent storage devices to store and manipulate the instructions and sensor data received from the analyte monitoring system. The computer system may also include communications facilities (e.g., wireless and/or wired) to enable transfer of data from the system to the computer. The computer system may include a display and/or output devices for identifying dropouts in the sensor data to a user. The computer system may include input devices and various other components (e.g., power supply, operating system, clock, etc.) that are typically found in a conventional computer system. In some embodiments, the computer system may be integral to the substrate handling system. For example, the computer system may be embodied as a handheld or portable receiver unit wirelessly communicates with the system.

The various methods described herein for performing one or more processes also described herein may be embodied as computer programs (e.g., computer executable instructions and data structures) developed using an object oriented programming language that allows the modeling of complex systems with modular objects to create abstractions that are representative of real world, physical objects and their interrelationships. However, any practicable programming language and/or techniques may be used. The software for performing the inventive processes, which may be stored in a memory or storage device of the computer system described herein, may be developed by a person of ordinary skill in the art based upon the present disclosure and may include one or more computer program products. The computer program products may be stored on a computer readable medium such as a server memory, a computer network, the Internet, and/or a computer storage device.

FIG. 4 depicts an example embodiment of a method of the present invention. The carrier handling and unloading/loading system is initially presented with a carrier for loading or unloading (402). Next, the sensor (e.g., on the end effector) is moved to a predefined position to check for the presence of a mapping feature that indicates the presence of an adapter insert (404). If an adapter insert is detected, the system may then map the substrate slots of the adapter insert, and if the adapter insert is not detected, the system may map the substrate slots of the substrate carrier (406).

Various other modifications and alterations in the structure and method of operation of the embodiments of the present disclosure will be apparent to those skilled in the art without departing from the scope of the present disclosure. Although the present disclosure has been described in connection with certain embodiments, it should be understood that the claims should not be unduly limited to such embodiments. It is intended that the following claims define the scope of the present disclosure and that structures and methods within the scope of these claims and their equivalents be covered thereby.

What is claimed is:

1. A substrate carrier adapter insert, comprising:
an adapter insert frame configured to be received within a substrate carrier, wherein the substrate carrier is configured to hold substrates of a larger size and the adapter insert frame is configured to hold substrates smaller than the larger size; and
a mapping feature coupled to, or integral with, the adapter insert frame, wherein the mapping feature is detectable, after the substrate carrier adapter insert is inserted into the substrate carrier, by interrupting a sensing beam that is parallel to a front opening of the substrate carrier and positioned outside the substrate carrier.

2. The substrate carrier adapter insert of claim 1, further comprising:
an upper frame portion of the adapter insert frame;
a lower frame portion of the adapter insert frame;
a frame extension adapted to be coupled to at least one of the upper frame portion or the lower frame portion; wherein the mapping feature is a part of the frame extension or coupled to the frame extension; and
a support rail of the adapter insert frame, wherein the support rail is coupled to and disposed between the upper frame portion and the lower frame portion.

3. The substrate carrier adapter insert of claim 1, further comprising:
an upper frame portion of the adapter insert frame;
a lower frame portion of the adapter insert frame;
a support rail of the adapter insert frame, wherein the support rail is coupled to and disposed between the upper frame portion and the lower frame portion, wherein at least one of the upper frame portion, the lower frame portion, or the support rail includes an extension comprising the mapping feature.

4. The substrate carrier adapter insert of claim 2, wherein the mapping feature is at least one of a tab shape or a contoured shape.

5. A substrate carrier adapter insert, comprising:
an adapter insert frame configured to be received within a substrate carrier, wherein the substrate carrier is configured to hold substrates of a larger size and the adapter insert frame is configured to hold substrates smaller than the larger size;
a plurality of support rails coupled to the adapter insert frame and adapted to support one or more of the substrates smaller than the larger size;
a frame extension; and
a mapping feature on the frame extension, the mapping feature detectable, after the substrate carrier adapter insert is inserted into the substrate carrier, by interrupting by a sensing beam that is parallel to a front opening of the substrate carrier and positioned outside the substrate carrier.

6. The substrate carrier adapter insert of claim 5, wherein the frame extension is adapted to be coupled to at least one of the adapter insert frame and the plurality of support rails.

7. The substrate carrier adapter insert of claim 5, wherein the frame extension is integrally formed from at least one of the adapter insert frame and the plurality of support rails.

8. The substrate carrier adapter insert of claim 5, wherein the mapping feature is at least one of a tab shape and a contoured shape.

9. The substrate carrier adapter insert of claim 5, wherein the mapping feature extends from the frame extension.

10. The substrate carrier adapter insert of claim 5, wherein the frame extension is coupled to, or integral with, a lower frame portion of the adapter insert frame.

11. The substrate carrier adapter insert of claim 5, wherein the mapping feature comprises a contoured shape.

12. The substrate carrier adapter insert of claim 11, wherein the contoured shape corresponds to a curved shape of the substrates smaller than the larger size.

13. The substrate carrier adapter insert of claim 5, wherein the mapping feature is at least one of a tab shape or a contoured shape.

14. A substrate carrier adapter insert, comprising:
an adapter insert frame configured to be received within a substrate carrier, wherein the substrate carrier is configured to hold substrates of a larger size and the adapter insert frame comprises support rails configured to hold substrates smaller than the larger size;
a frame extension coupled to the adapter insert frame; and
a mapping feature on the frame extension comprising a contoured shape that is detectable, after the substrate carrier adapter insert is inserted into the substrate carrier, by interrupting by a sensing beam that is parallel to a front opening of the substrate carrier and positioned outside the substrate carrier.

15. The substrate carrier adapter insert of claim 1, wherein the mapping feature is detectable by interrupting a sensing beam that is parallel to a front opening of the substrate carrier adapter insert, wherein the front opening is adapted for passage of the substrates smaller than the larger size.

16. The substrate carrier adapter insert of claim 15, wherein the front opening is defined by a spacing between a plurality of support rails that are adapted to support the substrates smaller than the larger size.

17. The substrate carrier adapter insert of claim 5, wherein the front opening is defined by a spacing between the plurality of support rails.

18. The substrate carrier adapter insert of claim 14, wherein the front opening is defined by a spacing between a plurality of support rails that are adapted to support the substrates smaller than the larger size.

* * * * *